(12) United States Patent
Fridholm et al.

(10) Patent No.: US 7,167,804 B2
(45) Date of Patent: Jan. 23, 2007

(54) UTILITY METER HAVING PROGRAMMABLE PULSE OUTPUT

(75) Inventors: Gregory Andrew Fridholm, Flora, IN (US); David Allan Stenberg, Lebanon, IN (US); John Voisine, Lafayette, IN (US)

(73) Assignee: Landis+Gyr, Inc., Lafayetter, IN (US)

( * ) Notice: Subject to any disclaimer, the term of this patent is extended or adjusted under 35 U.S.C. 154(b) by 0 days.

(21) Appl. No.: 11/112,850

(22) Filed: Apr. 22, 2005

(65) Prior Publication Data

US 2006/0001415 A1    Jan. 5, 2006

Related U.S. Application Data

(60) Provisional application No. 60/564,537, filed on Apr. 22, 2004.

(51) Int. Cl.
*G01R 21/00* (2006.01)

(52) U.S. Cl. .............................. 702/62; 702/60; 702/61; 702/122; 702/123; 702/179; 702/182; 702/183; 702/186; 702/187; 702/185; 324/142

(58) Field of Classification Search ................ 702/62, 702/122, 123, 179, 182, 183, 186–188, 60, 702/61; 324/74, 771, 141, 142
See application file for complete search history.

(56) References Cited

U.S. PATENT DOCUMENTS

| | | | |
|---|---|---|---|
| 4,509,128 A * | 4/1985 | Coppola et al. .............. 702/61 |
| 4,665,358 A | 5/1987 | Bullock et al. |
| 4,963,820 A | 10/1990 | Medlin |
| 5,059,896 A | 10/1991 | Germer et al. |
| 5,315,235 A | 5/1994 | Atherton et al. |
| 5,525,898 A | 6/1996 | Lee, Jr. et al. |
| 5,548,527 A | 8/1996 | Hemminger et al. |
| 5,555,508 A | 9/1996 | Munday et al. |
| 6,374,188 B1 | 4/2002 | Hubbard et al. |
| 6,459,258 B1 | 10/2002 | Lavoie et al. |
| 6,486,652 B1 | 11/2002 | Quellette et al. |
| 6,564,159 B1 | 5/2003 | Lavoie et al. |
| 6,577,961 B1 * | 6/2003 | Hubbard et al. .............. 702/60 |
| 6,611,772 B1 | 8/2003 | Lavoie et al. |

\* cited by examiner

*Primary Examiner*—Marc S. Hoff
*Assistant Examiner*—Phuong Huynh
(74) *Attorney, Agent, or Firm*—Maginot Moore & Beck

(57) ABSTRACT

An apparatus for measuring energy consumption includes an input circuit and a processing circuit. The input circuit is operable to generate a first digital signal representative of a line voltage waveform and a second digital signal representative of a line current waveform. The processing circuit is operable to generate energy consumption data based on the first digital signal and the second digital signal. The processing circuit is further operable to generate a first pulse waveform having a plurality of output pulses based on the energy consumption data, each output pulse corresponding to a quantity of energy consumed, the first pulse waveform having a select one of a plurality of modes. The processing circuit is further operable to provide the first pulse waveform to a meter output.

23 Claims, 6 Drawing Sheets

UTILITY METER HAVING PROGRAMMABLE PULSE OUTPUT

This application claims the benefit of U.S. provisional patent application Ser. No. 60/564,537, which was filed on Apr. 22, 2004, and which is incorporated herein by reference.

FIELD OF THE INVENTION

The present invention relates to utility meters, and more particularly to utility meters having a processing circuit that generates commodity consumption data using digital signals.

BACKGROUND OF THE INVENTION

Utility meters, including for example electricity, gas, water and oil meters, operate to measure the consumption of a commodity by a residence, factory, commercial establishment or other such facility. Utility service providers employ utility meters to track individual customers' usage of the utility-provided commodities. Utilities track customer usage for many purposes, including billing and tracking demand for the commodity.

Referring specifically to electricity meters, electricity meters have historically measured energy consumption using electromechanical hardware, such as an arrangement of rotating disks. Such meters are still in widespread use. In these meters, the rotating disks are driven by electromagnetic forces generated by signals produced in the measurement circuits of the meter. The rotations of the disk are recorded in a register. One type of meter register, an electromechanical registers, consists of numbered dials driven by gears. One drawback of meters having electromechanical registers is that the energy consumption data must be manually obtained from the physical meter device. In other words, electromechanical registers require that utility providers employ field technicians, or "meter-readers," to visit customers' facilities and visually read the commodity consumption data from the registers.

An advance in the art is the implementation of electronic registers. Electronic registers employ electronic hardware, such as solid-state devices and memory circuits, to register commodity consumption data measured by the electromechanical rotating disk. To obtain consumption information from the rotating disk, the electronic registers received pulse signals generated by an optical detector that detects rotations of the rotating disk. Each pulse represents a rotation (or part of a rotation) of the disk and thus also represents a quantity of energy consumed.

The electronic register meters, or at least the meters configured to generate pulses representative of consumed energy, allow for the implementation of automatic meter reading ("AMR") equipment. AMR equipment is desirable because it eliminates the costs associated with traveling meter reading technicians. AMR devices include communication devices that obtain energy consumption data and communicate the data remotely to the service provider. Common AMR devices for residential meters operate to obtain the pulses generated by the meter, and periodically report a sum of the pulses to the service provider.

Electromechanical meters over time have evolved such that they produce output pulses in one or more of a few different standard formats or modes. While the general notion that a pulse represents a predefined quantity of energy is standard to each of the standard pulse formats, the shape and behavior of the pulses varies from pulse format to pulse format.

For example, some meters produce pulses in a return-to-zero format. Return-to-zero format pulses consist of a positive transition to a high state, and then a transition back to a low state after a predetermined "pulse period" or on-time. Other meters produce pulses in an alternating format. Alternating format pulses change from the current signal logic level to the opposite signal logic level, and then maintain that state until the next pulse is produced. The next pulse changes the signal level back to the first logic level.

In further detail, FIGS. 1a–3 show a number of pulse configurations that may be generated by electromechanical meters. For example, FIG. 1a shows a pulse train 10 including prior art "return-to-zero" pulses 11. Each pulse 11 has a first transition 12, a predetermined duration 14 at the new state, and a second transition 16 returning to the original state. In other words, a single pulse starts and ends at the original state, and typically has a predetermined or at least a minimum pulse period. FIG. 1b shows a similar pulse train 10' in a reverse polarity mode, wherein originating state of each pulse 11' is a high logic level instead of a low logic level. FIG. 2a shows a prior art "alternating state" pulse train 20 that consists of a series of pulses 21, 22, 23, 24, 25, 26 and 27 wherein each pulse merely changes the signal logic state and remains in that logic state until the next pulse. FIG. 2b shows a differential alternating state pulse train 25 which includes two identical pulse trains 26 and 27 having opposite polarity. The differential pulse train 25 is used in many meters and is often referred to as a KYZ pulse signal.

FIG. 3 shows a pair of pulse signals 32 and 34 that together generate a four state output signal consisting of a repeating sequence of 00, 01, 11, and 10. A four state sequence may be used to identify the direction of power flow. In particular, in some cases, power may flow in either direction. In a residential meter, for example, a customer may have an electricity generating windmill that in some cases actually provides net power to the service provider through the meter. A normal pulse generating electromechanical meter can not convey directional information, even though the rotating disk would be rotating in reverse. However, an electromechanical meter configured to provide a four state pulse signal would generate the sequence 10, 11, 01, 00 when running in reverse, and generate the sequence 00, 01, 11, 10 when running in the forward direction.

As discussed above, different meters may generate any of the above output pulse modes. Accordingly, AMR devices are typically designed to accept one or more of these pulse formats.

However, because not all AMR devices accept each pulse format, inefficiencies can result in attempting to match AMR devices with meters. In most cases, this problem may be addressed by purchasing appropriate AMR devices to accommodate the pulse formats employed by all or most residential meters in a particular service area.

It would be advantageous, however, to allow service providers many choices of AMR devices regardless of the pulse type the AMR devices are configured to read. Accordingly, there is a need for a metering arrangement that reduces the restrictions on the interface between available AMR devices and meters.

SUMMARY OF THE INVENTION

The above described invention addresses the above need, as well as others, by providing an electronic meter that generates an output pulse signal having a select one of a plurality of pulse modes. Such a meter is configurable to generate a desired output pulse signal, and could thus be configured to accommodate a large number of available AMR devices. In addition, such output pulse signals may be usable by other meter add-on products that may have different requirements for interfacing. Thus, the present invention provides advantages even in meters that do not employ AMR.

A first embodiment of the invention is an apparatus for measuring energy consumption that includes an input circuit and a processing circuit. The input circuit is operable to generate a first digital signal representative of a line voltage waveform and a second digital signal representative of a line current waveform. The processing circuit is operable to generate energy consumption data based on the first digital signal and the second digital signal. The processing circuit is further operable to generate a first pulse waveform having a plurality of output pulses based on the energy consumption data, each output pulse corresponding to a quantity of energy consumed, the first pulse waveform having a select one of a plurality of modes. The processing circuit is further operable to provide the first pulse waveform to a meter output.

The apparatus described above allows for electricity metering using digital measurement circuitry that also generates pulses in a plurality of modes. Such modes may include one or more return-to-zero pulse modes and/or alternating pulse modes, and even four state signal modes such as that shown in FIG. 3.

A second embodiment of the invention is similar. However, the processing circuit is operable to generate a first pulse waveform wherein the first pulse waveform is formed based on a plurality of user-defined parameters. The user-defined parameters may include a pulse mode definition, or may alternatively or additionally define a minimum on-time or off-time for the pulse, and/or may define other parameters of the pulse waveform such as polarity.

A third embodiment of the invention is a method that comprises receiving in a meter a user selection of one of a plurality of predefined pulse modes, each pulse mode corresponding to a pulse signal wherein each pulse represents a quantity of a commodity being consumed. The method also includes employing digital circuitry within the meter to determine a quantity of a commodity consumed by a load connected to the meter. The method further comprises generating a first pulse waveform in accordance with the user selected one of the plurality of predefined pulse modes, and providing the first pulse waveform to a meter output.

The above described method may be implemented in any commodity meter that produces output pulses, including but not limited to electricity meters. The above method allows the user to configure the meter for a particular pulse mode.

The above described features and advantages, as well as others, will be more readily apparent to those of ordinary skill in the art by reference to the following detailed description and accompanying drawings.

DETAILED DESCRIPTION

Figure 1A:
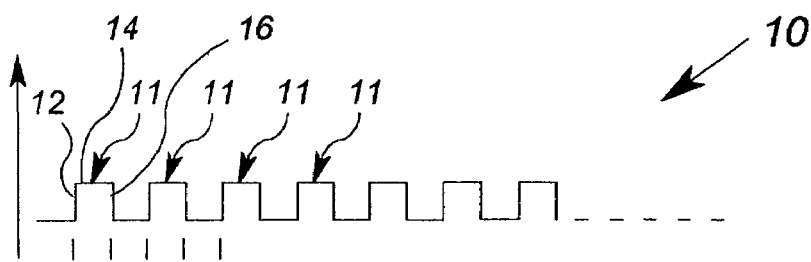
FIG. 1a shows a first exemplary prior art pulse signal having a first format that may be compatible with certain meter component modules.
Figure 1B:
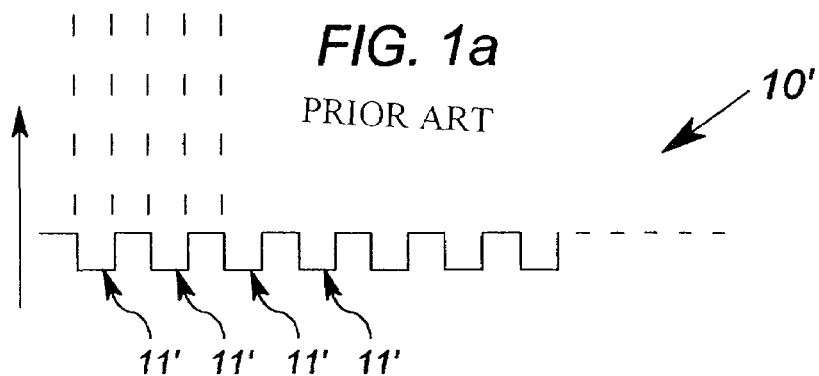
FIG. 1b shows a timing diagram of a second exemplary prior art pulse signal having a second format that may be compatible with certain meter component modules.
Figure 2A:
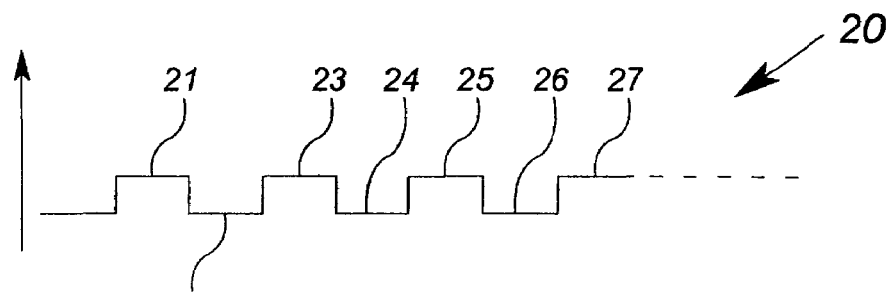
FIG. 2a shows a timing diagram of a third exemplary prior art pulse signal having a third format that may be compatible with certain meter component modules.
Figure 2B:
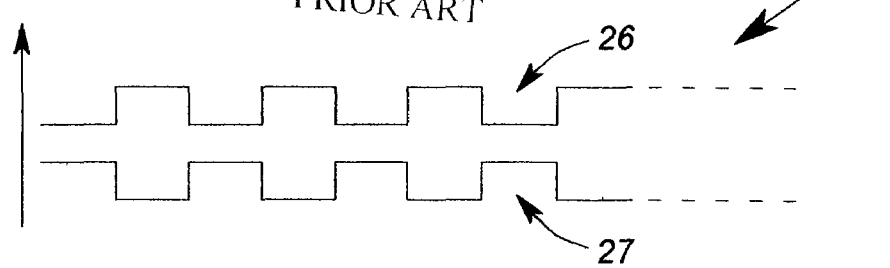
FIG. 2b shows a timing diagram of a fourth exemplary prior art pulse signal having a fourth format that may be compatible with certain meter component modules.
Figure 3:
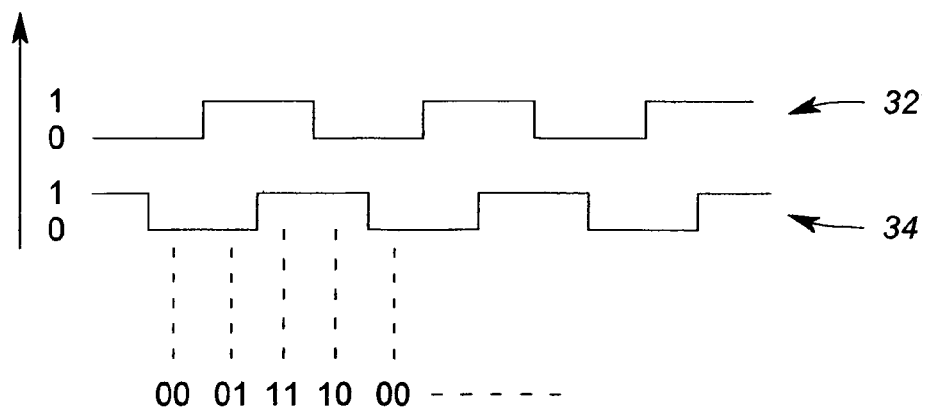
FIG. 3a shows a timing diagram of a four state pulse signal having a format that may be compatible with certain meter component modules.
Figure 4:
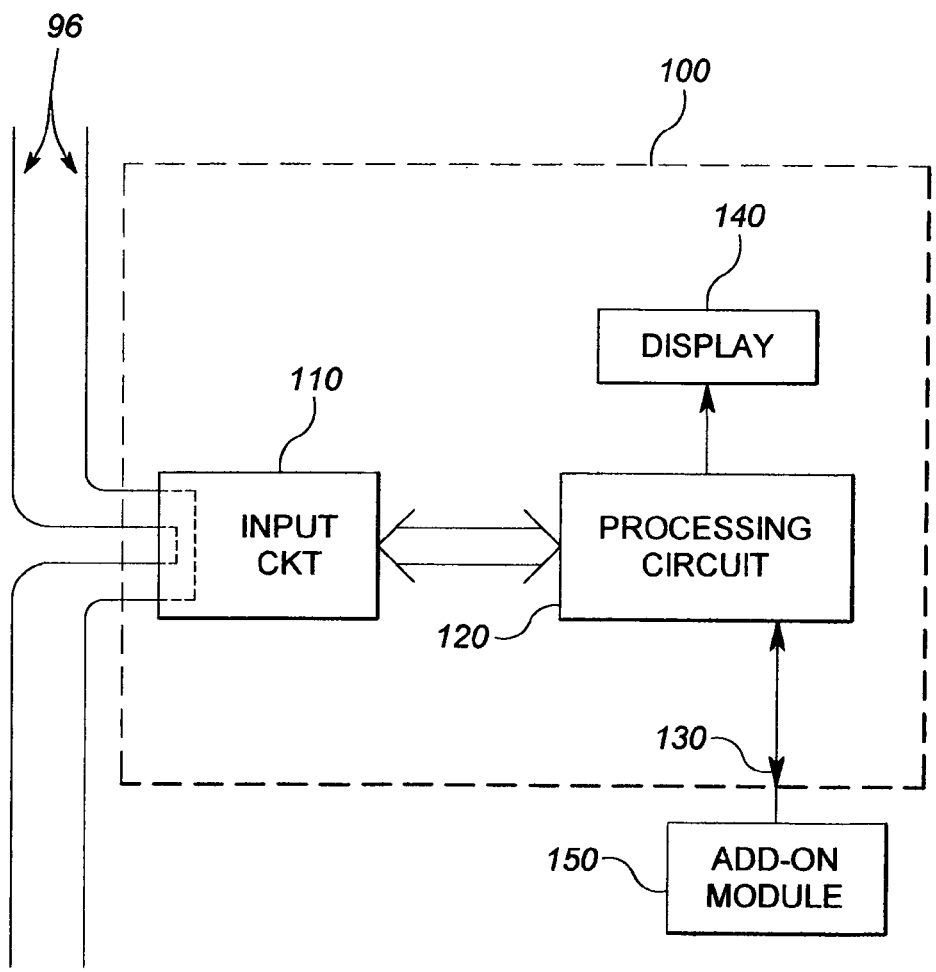
FIG. 4 shows a block diagram of an exemplary embodiment of a meter according to the present invention.

FIGS. 1a, 1b, 2a, 2b and 3 are described above in the background section in further detail. FIG. 4 shows a block diagram of an exemplary meter 100 according to the invention. The meter 100 is an apparatus for measuring energy consumption that includes an input circuit 110, a processing circuit 120, a meter output 130, and an optional display 140. The meter output 130 is configured to be connected to an add-on module 150, which may for example be an AMR device, load control device, pulse recorder or the like.

In the embodiment described herein, the input circuit 110 is a circuit operable to generate a first digital signal representative of a line voltage waveform and a second digital signal representative of a line current waveform. To this end, the input circuit 110 may suitably comprise current and voltage sensors, not shown, and one or more analog-to-digital converters, not shown. (See e.g. FIG. 5). Many circuits capable of generating digital voltage and current waveform signals are well known in the art. Suitable examples of input circuits having such capabilities are described in U.S. Pat. No. 6,374,188; U.S. Pat. No. 6,564,159; U.S. Pat. No. 6,121,158 and U.S. Pat. No. 5,933,004, all of which are incorporated herein by reference.

The processing circuit 120 is a device that employs one or more processing devices such as microprocessors, microcontrollers, digital signal processors, discrete digital circuits and/or combinations thereof. The processing circuit 120 is operable to generate energy consumption data based on the first digital signal and the second digital signal. For example, the processing circuit 120 may generate watt-hours, VAR-hrs, power factor, root-mean-square voltage and/or current, or combinations of any of the foregoing. Various processing circuits operable to generate energy consumption data from digital voltage and digital current measurement signals are well known in the art. Suitable examples of such circuits are described in U.S. Pat. No. 6,374,188; U.S. Pat. No. 6,564,159; U.S. Pat. No. 6,121,158 and U.S. Pat. No. 5,933,004. A further example is described below in connection with FIG. 5.

The processing circuit 120 is further operable to generate a first pulse waveform having a plurality of output pulses based on the energy consumption data, each output pulse corresponding to a quantity of energy consumed. In accordance with embodiments of the invention, the first pulse waveform has a select one of a plurality of predefined modes or formats. Thus, in addition to generating energy consumption data, the processing circuit 120 is capable of generating any of a number of output pulse signal formats. Preferably, the processing circuit 120 may generate pulse formats or modes such as those shown in FIGS. 1*a*, 1*b*, 2*a*, 2*b* and 3. Alternatively, or additionally, the processing circuit 120 may produce pulses having predetermined and configurable parameters such as those defining duty cycle, pulse duration and/or polarity.

Figure 7:
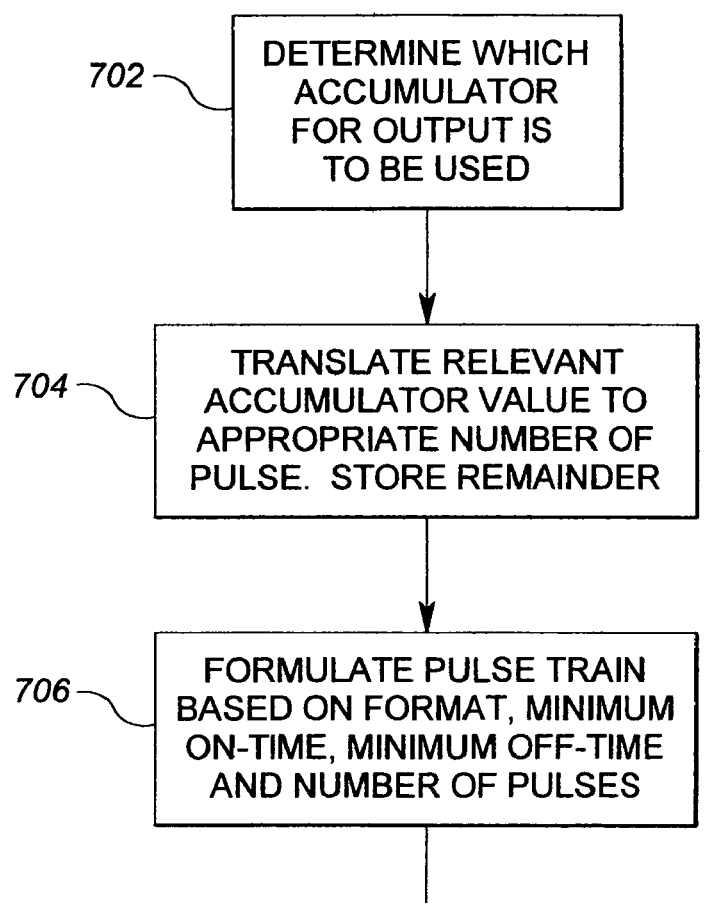
FIG. 7 shows a flow diagram of an pulse generation operation of the processing device of the meter of FIG. 5.

To generate the pulse waveform signal, the processing circuit 120 receives the energy consumption data, and then performs a pulse generating routine that corresponds to the selected output pulse format. The routines of several pulse generating formats may overlap, or may even constitute the same routine simply having different parameters. FIG. 7 described below shows an exemplary set of operations that may be used by the processing circuit 120 to generate a select one of the possible pulse formats.

The processing circuit 120 is operable to provide the first pulse to the meter output 130. In many cases, the meter output 130 may simply be a microprocessor or microcontroller integrated circuit output. However, in other embodiments, the meter output 130 may include a driver circuit that is capable of producing sufficient output energy to drive relays.

As discussed above, the meter output 130 is configured to be operably connected to one or more add-on devices, e.g. add-on device 150. The processing circuit 120 is preferably configured to provide the pulse waveform signal in the specific format employed by the add-on device 150. In other cases, the processing circuit 120 may be configured to provide a desired output format for other uses.

The meter display 140, which is optional, may be a digital display such as a liquid crystal display. It will be appreciated that the exact nature of the display is not particularly important to the implementation of the invention. Nevertheless, there is an advantage of including at least some display capabilities. LCD displays, moreover, have been found to have a particularly advantageous set of qualities for use in electronic meters.

In operation, the meter 100 is connected to measure power flowing through power lines 96. The input circuit 110 generates a digital voltage signal, which preferably is a series of digital samples that represent a scaled version of the voltage waveform(s) on the one or more of the power lines 96. The input circuit 110 also generates a digital current signal, which preferably is a series of digital samples that represent a scaled version of the current waveform(s) on the one or more of the power lines 96.

The processing circuit 120 receives the digital voltage and current signals and generates energy consumption data, for example, data representative of kilowatt-hours or the like. The processing circuit 120 provides information representative of at least some of the energy consumption data to the display 140. The processing circuit 120 further generates the first pulse waveform and provides the first pulse waveform to the meter output 130. To this end, the processing circuit 120 generates the first pulse waveform based on the energy consumption data and stored information that defines the pulse output mode. In general, the energy consumption data will define the frequency of the pulses in the first pulse waveform, and the stored information will define the duration, shape and/or style of the pulses. The stored information may suitably be in the form of a stored word or set of flags that enables certain operations to produce suitable pulse signals.

It is noted that the processing circuit 120 preferably includes an input, not shown in FIG. 4, that is capable of receiving information that changes the configuration of the first pulse waveform.

The above described meter 100 has the advantage of being compatible with a variety of preexisting add-on modules. With the market including add-on modules that require different pulse output configurations, the use of the meter 100 allows for increased options for implementation of the meter. New add-on modules created for pulse-generating meters may also be accommodated by the meter 100.

Figure 5:
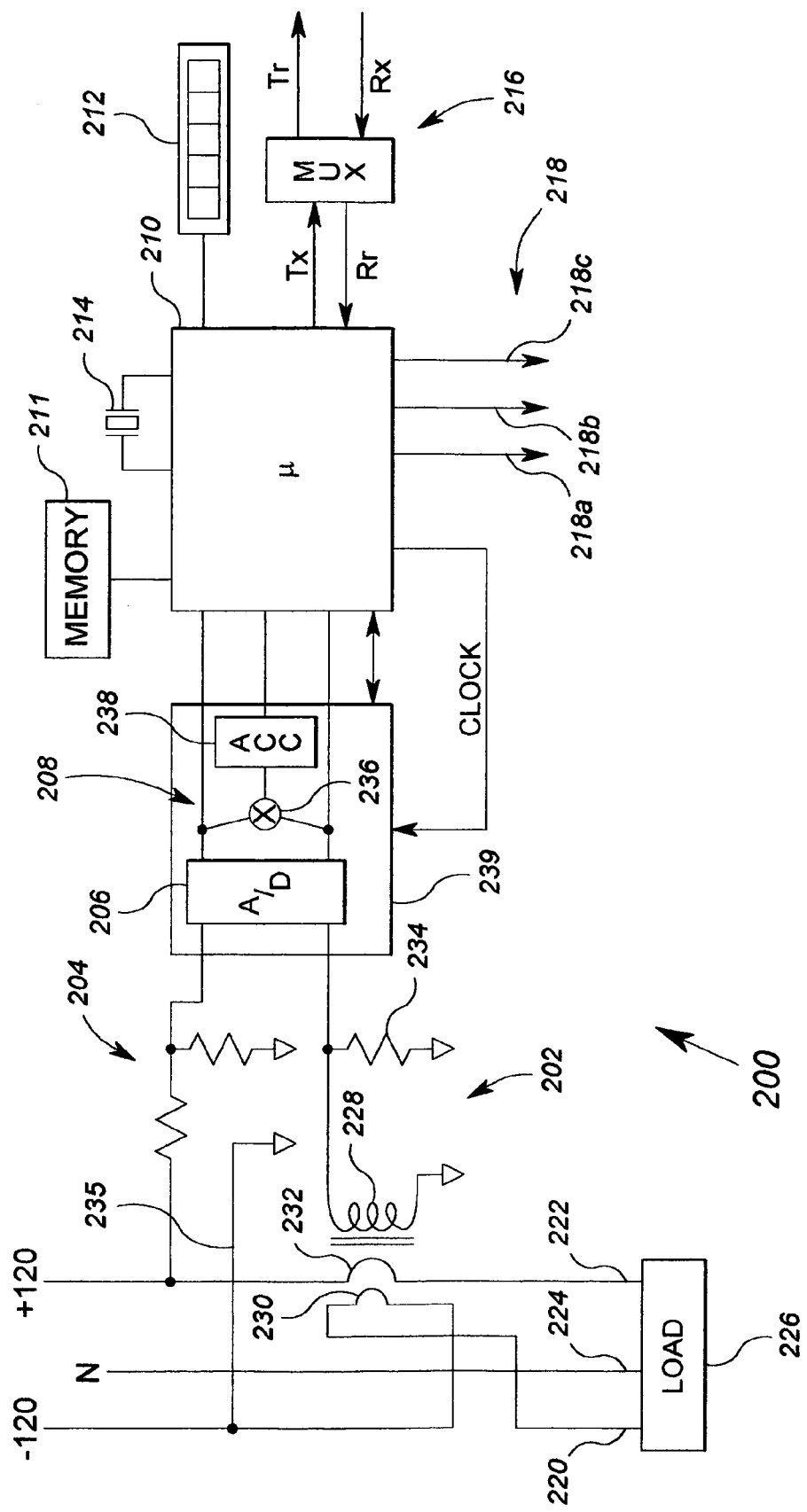
FIG. 5 shows in further detail a schematic block diagram of one example of a specific embodiment of the meter of FIG. 4.

FIG. 5 shows in further detail an electricity meter 200 that represents a specific example of the meter 100 of FIG. 4.

The electricity meter 200 is shown in context installed in a single phase power system common to residential electrical systems. The electrical system includes a −120 volt power line 220, a +120 volt power line 222, and a neutral line 224.

The electricity meter 200 includes an analog current input circuit 202, an analog voltage input circuit 204 and an analog-to-digital ("A/D") converter circuit 206. The electricity meter 200 further includes a processing circuit that includes a multiply-accumulator circuit 208 and a microcontroller 210. The electricity meter 200 also includes a display 212, an oscillator 214, a communication circuit 216, and an output circuit 218. It is noted that the meter 200 may include additional elements as a matter of design choice. For example, the meter 200 may include additional communication circuits.

While the electricity meter 200 in FIG. 5 is configured to measure a residential single phase service connection as is known in the art, it is be appreciated that those of ordinary skill in the art may readily modify the arrangement of FIG. 1 to accommodate other known service connections including polyphase service connections.

In the embodiment described herein, the power lines 220, 222 and a neutral line 224 are operably coupled to provide single-phase power from a utility service provider, not shown, to a load 226. The analog current input circuit 202 and analog voltage input circuit 204 are coupled to the power lines 220 and 222.

The analog current input circuit 202 includes a current transformer ("CT") 228, first and second current coils 230 and 232, and a burden resistor 234. The first current coil 230 is coupled in the path of the power line 220 such that the power flowing through the first current coil 230 represents the current delivered to the load 226 through the power line 220. The second current coil 232 is similarly coupled in the path of the power line 222.

The CT 228 is in a current sensing relationship with each of the current coils 230 and 232. To this end, the CT 228 may suitably be a toroid having a circular core and a winding configured in a manner well known in the art. The current coils 230 and 232 are conductors that pass through the center opening of the toroid. Because of the relative winding ratio between the current coils 230 and 232 and the CT 228, the CT 228 generates a scaled down version of the current flowing on the power lines 220, 222. The CT 228 is further operably coupled to provide an analog current measurement signal based on this scaled down version of the power line current to the A/D converter circuit 206. To this end, the burden resistor 234 preferably comprises a resistor that is coupled across the CT 228 between the CT 228 and the A/D converter circuit 206.

The analog voltage measurement circuit 204 comprises a resistive voltage divider coupled between the power line 222 and the A/D converter circuit 206. A connection 235 from the power line 220 is used as to provide the "ground" reference for the voltage divider.

The A/D converter circuit 206 may suitably be one or more successive-approximation analog to digital converters or sigma-delta converters. The multiplier-accumulator circuit 208 may suitably be a digital signal processing device or the like that includes a multiplication function 236 and an accumulator 238. The A/D converter 206 and the multiplier-accumulator circuit 208 may be combined onto a single integrated circuit, referred to herein as a measurement IC 239.

The A/D converter circuit 206 is operably connected to provide digitized voltage measurement signals and digitized current measurement signals to the multiplication function 236 and to the microcontroller 210. As discussed above, the digitized voltage measurement signal comprises a sequence of digital samples representative of the instantaneous voltage differential between the power lines 220 and 222, while the digitized current measurement signal comprises a sequence of digital samples representative of the instantaneous current through the power lines 220 and 222. The multiplication function 236 is configured to multiple concurrent samples of the digitized voltage and current measurement signals. The multiplication function 236 is further configured to provide the resulting products to the accumulator 238. The accumulator 238 maintains a running total value representative of total energy consumed (or generated, in the case of reverse power flow).

Thus, the multiplication function 236 and accumulator 238 cooperate to carry out the following well-known energy equation.

Energy (over a time $T$)=$\Sigma Is(n)*Vs(n)$, for samples $n$=1 to $N$, where N samples occur during the time T, and where Is(n) is the nth current sample value and Vs(n) is the corresponding nth voltage sample value.

The microcontroller 210 is a programmable microcontroller device that is programmed to carry out the steps described herein. In general, the microcontroller 210 is operably connected to receive the value stored in the accumulator 238, as well as the instantaneous voltage and current sample values from the A/D converter circuit 206. The microcontroller 208 further processes the value from the accumulator 238 to generate a registered energy consumption value as well as display information and the first pulse waveform. Further discussion regarding such operations is provided below in connection with FIG. 6.

The output circuit 218 in the embodiment described herein includes first, second and third outputs 218a, 218b and 218c. In various output modes, different outputs may be programmed to provide different types of pulse outputs. More detailed discussion of the programming of the outputs 218a, 218b and 218c is provided further below.

The microcontroller 210 is further operable to receive, among other things, information identifying a pulse mode selection for each of the outputs 218a, 218b and 218c through the communication circuit 216. To this end, the communication circuit 216 may be an optical communication circuit, RS-232 circuit or other circuit that enables the microcontroller 210 to receive input from an external device, not shown.

The pulse mode selection information in the embodiment described herein is stored in a data "table" within a memory 211 within the meter 200. As is known in the art, ANSI standard tables have been defined for electricity metering parameters. Table 5 is reserved as a table that may be custom configured for use by each meter manufacturer. The pulse format or mode selection value is preferably in the form of a byte or word that is stored in ANSI Table 5. A mode selection value is preferably stored for each of the outputs 218a, 218b and 218c, such that there are three total stored mode values.

Table 1 provided below describes the plurality of selectable mode values:

TABLE 1

| Mode Value | Description |
|---|---|
| 0 | Unused |
| 1 | Inactive |
| 2 | KYZ+ |
| 3 | KYZ− |
| 4 | KYZ Add |
| 5 | RTZ Pulse+ |
| 6 | RTZ Pulse− |
| 7 | RTZ Pulse Add |
| 8 | Quadrature |
| 9 | Direction |

The unused and inactive modes do not generate output pulses. The unused mode does not generate any output and the inactive mode will generate a constant value representative of a configured polarity value.

The KYZ modes provide an alternating pulse waveform such as those described above in connection with FIGS. 2a and 2b. The KYZ+ mode only provides pulses representative of energy received by the load 226. The KYZ− mode only provides pulses representative of energy generated by the load 226 (these are less common). The KYZ Add mode provides a sum of the absolute value of energy received and generated. This value is used for security/tamper detection purposes.

The RTZ Pulse modes provide a return-to-zero pulse waveform having a predefined on-time or pulse duration. RTZ pulses are described above in connection with FIGS. 1a and 1b. The RTZ Pulse+ mode only provides pulses representative of energy received by the load 226. The RTZ Pulse− mode only provides pulses representative of energy generated by the load 226 (uncommon). The RTZ Pulse Add mode provides a sum of the absolute value of energy received and generated, which again may be used for security purposes as is known in the art.

The Quadrature mode provides alternating pulses on two outputs that operate in conjunction to form a four state output signal such as that described above in connection with FIG. 3. Because the Quadrature mode requires two outputs, selection of this mode for one output necessarily results in a selection of the Quadrature mode for another of the outputs.

The Direction mode provides a signal that indicates whether energy is being received by the load 226 or generated by the load 226. In many cases, this mode will be combined with at least one other RTZ Pulse or KYZ mode.

The memory 211 stores a mode value as described above for each of the outputs 218a, 218b, and 218c. Thus, for example, if a utility requires KYZ information, then the output 218a may be assigned to KYZ+ mode, the output 218b may be assigned to KYZ− mode, and the output 218c may be assigned to KYZ Add mode. The utility could then generate billing information using the KYZ+ and KYZ− pulses, and verify security using the KYZ Add pulses. As discussed above, because the Quadrature mode requires two outputs, saving the Quadrature mode value for 218a or 218b will cause both outputs 218a and 218b to be in Quadrature mode.

In the embodiment described herein, the memory 211 also stores polarity information as well as minimum on-time and minimum off-time for outputs 218a, 218b and 218c. The memory 211 also stores a pulse/Wh value representative of the amount of energy that is represented by each "pulse" in the respective pulse signal. In particular, since each of the possible pulse signal formats specifies that a pulse (transition) represent a quantity of energy consumed, the stored pulse/Wh value is employed by all the formats. Information representing the pulse/Wh may thus be stored for each of the outputs 218a, 218b and 218c if all three outputs are in use.

In operation, the electrical energy will typically flow toward the load through the power lines 220 and 222. The current on the power lines 220 and 222 passes through the current coils 230 and 232 and translates to the CT 228. The CT 228 provides a scaled down version of the current waveform to the burden resistor 234. The burden resistor 234 generates the scaled down version of the current waveform to a voltage waveform. The resulting voltage waveform is representative of the current waveform on the power lines 220 and 222, and is referred to as the analog current measurement signal.

At the same time, the analog voltage measurement circuit 204 generates a scaled down voltage signal representative of the voltage on the power lines 220 and 222. The resulting signal is referred to as the analog voltage measurement signal. The A/D converter circuit 206 receives both the analog voltage and analog current measurement signals and generates corresponding digital voltage and current measurement signals therefrom.

The A/D converter circuit 206 provides the digital voltage and current measurement signals to the multiplication function 236 and also directly to outputs of the measurement IC 239. The multiplication function 236 multiplies concurrent voltage and current samples of the digital voltage and current measurement signals and provides the resulting product to the accumulator 238. The accumulator 238 adds the product received from the multiplication function 236 to a running total. The accumulator 238 has an output that is provided as an output of the measurement IC 239.

Figure 6:
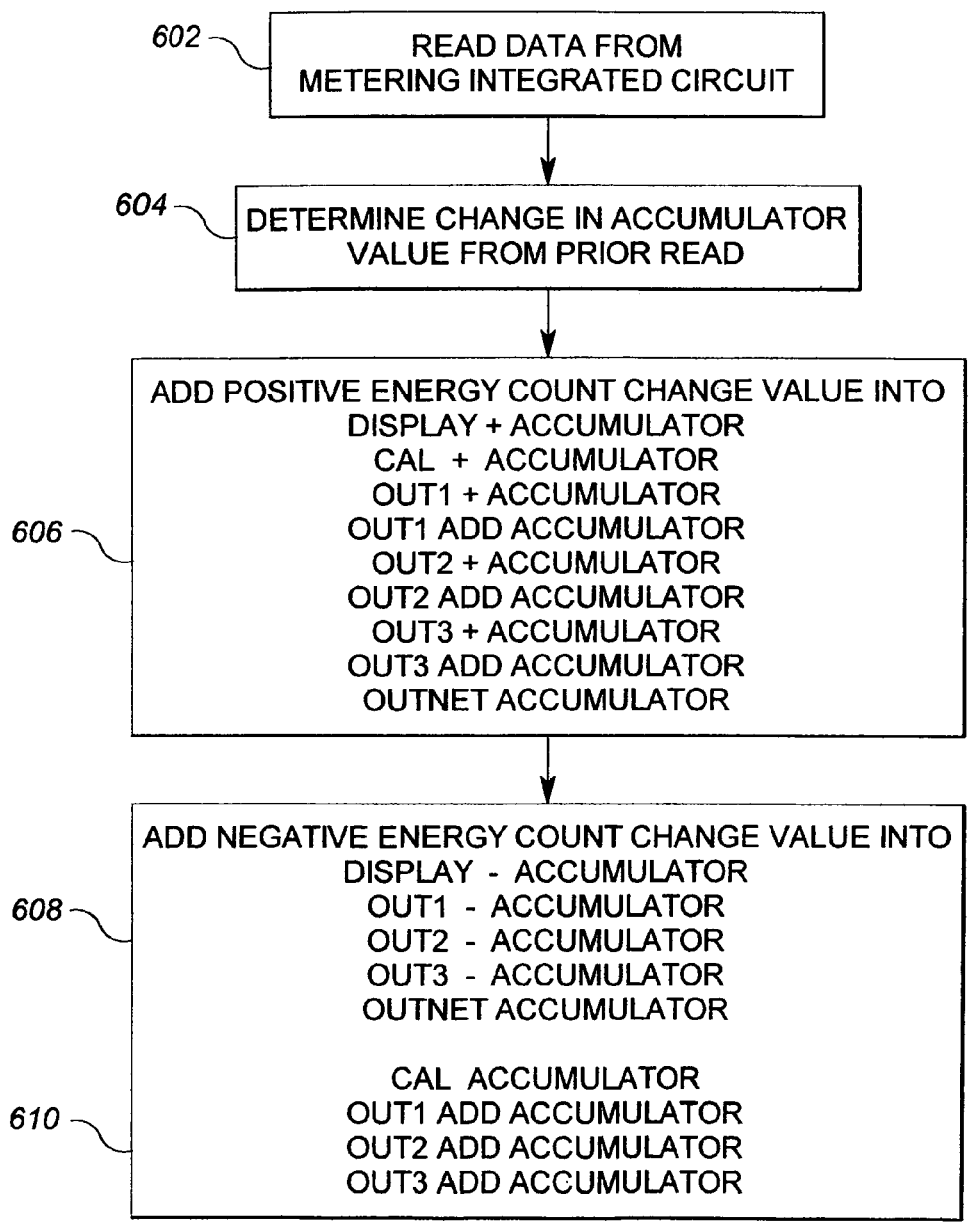
FIG. 6 shows a flow diagram of an energy consumption data registration operation of a processing device of the meter of FIG. 5.

The microcontroller 210 from time to time receives the value of the accumulator 238 ("Count_Value") and generates display information therefrom, and furthermore generates pulse signals at one or more of the outputs 218a, 218b and/or 218c if such outputs are enabled. FIG. 6 shows an exemplary flow diagram of pertinent operations of the microcontroller 210.

The microcontroller 210 basically operates by performing various tasks at different times based on task priority and frequency, as is known in the art. The flow diagrams of FIGS. 6 and 7 may be broken up into tasks in different ways by those of ordinary skill in the art. The split between the operations of the microcontroller as illustrated in FIGS. 6 and 7 show one suitable way in which such tasks may be divided. It will further be noted that the microprocessor may perform a plurality of other tasks that are not directly related to pulse signal formation and which would be known to those of ordinary skill in the art.

Figure 8:
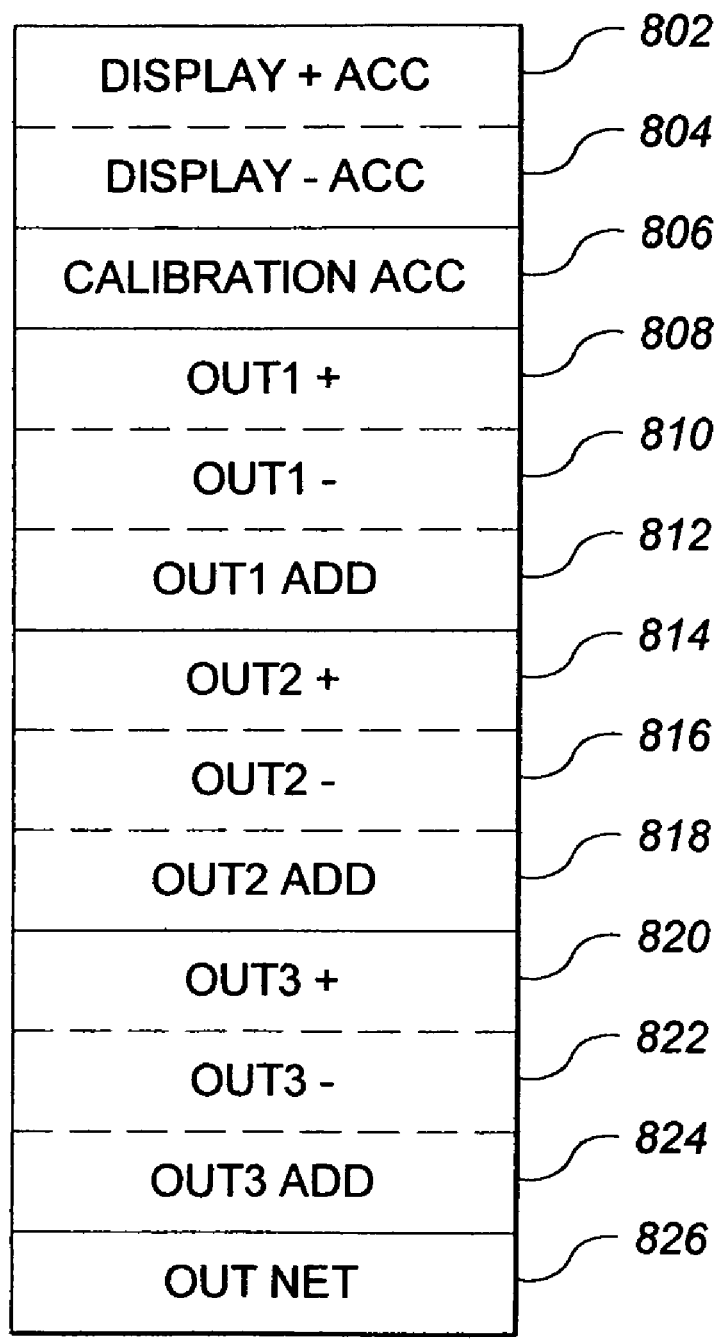
FIG. 8 shows a representative block diagram of accumulation registers of the processing device of the meter of FIG. 5.

Referring now to FIG. 6, the microcontroller 210 operates to obtain energy consumption data from the metering IC 239 and allocates the consumption data to different internal registers for processing. Referring to FIG. 8, the microcontroller 210 maintains a number of registers relating to the different outputs, including the display 212. Specifically, registers 802 and 804 relate to the display 212. Register 806 relates to a calibration routine. Registers 808, 810 and 812 relate to the first output 218a and represent, respectively, an OUT1+ accumulator, an OUT1− accumulator, and an OUT1Add accumulator, respectively. Registers 814, 816 and 818 relate to the second output 218b and represent, respectively, an OUT2+ accumulator, an OUT2− accumulator, and an OUT2Add accumulator, respectively. Registers 820, 822 and 824 relate to the third output 218c and represent, respectively, an OUT3+ accumulator, an OUT3− accumulator, and an OUT3Add accumulator, respectively. In the embodiment described herein, the microcontroller 210 further includes a single OUTadd register 826, that may be associated with at least two of the outputs 218a and 218b.

Referring again to FIG. 6, in step 602, the microcontroller 210 periodically reads data, including the value of the accumulator 238 ("Count Value") from the measurement IC 239. The microcontroller 210 preferably reads the Count_Value, among other things, from three to ten times per second. After each read of the Count_Value in step 602, the microcontroller 210 proceeds to step 604.

In step 604, the microcontroller 210 determines the change in the Count Value since the last execution of step 602. The difference, Count_Change, represents the energy consumed (or generated) since the last reading of the Count_Value.

Then, if Count_Change is a positive value, meaning that energy has been provided to the load 226, then in step 606 the microcontroller 210 adds the Count_Change value to the accumulators that are affected by positive energy flow, and according to their mode. These accumulators include the DISPLAY+ accumulator 802, the CALIBRATION accumulator 806, the OUT1+ accumulator 808, the OUT1Add accumulator 812, the OUT2+ accumulator 814, the OUT2Add accumulator 818, the OUT3+ accumulator 820, the OUT3Add accumulator 824, and the OUTNet accumulator 826.

If, however, Count_Change is a negative value, meaning that energy has been generated by the load 226, then in step 608 the microcontroller 210 adds the Count_Change value to the accumulators that track only negative energy flow. These accumulators include the DISPLAY-accumulator 804, the OUT1− accumulator 810, the OUT2− accumulator 816, and the OUT3− accumulator 822. In addition, the negative Count_Change value is added to the "add" registers that operate to add the positive and negative energy flows. Stated another way, the absolute value of the Count_Change value is added from the "add" registers. The "add" registers include the CALIBRATION accumulator 806, the OUT1Add accumulator 812, the OUT2Add accumulator 818, the OUT3Add accumulator 824, and the OUTNet accumulator 826.

Once steps 606, 608 and 610 have been completed (as necessary), the microcontroller 210 returns to step 602 after a suitable period. In the meantime, the microcontroller 210 may execute other tasks. Such other tasks include, but are not limited to, the tasks described below in connection with FIG. 7, as well as display tasks. Display tasks cause the display of information representative of the values accumulated in the DISPLAY+ accumulator 802 and/or the DISPLAY− accumulator 804.

FIG. 7 shows a flow diagram of an exemplary task that may be generated for each of the outputs 218a, 218b and 218c. The task is preferably performed for each output 218a, 218b, 218c after each update to the accumulators 808–824. However, as will become more readily apparent further below, the task of FIG. 7 may suitably be performed at longer intervals. Moreover, the task of FIG. 7 may be performed at different intervals for each of the different outputs 218a, 218b and 218c.

In step 702, the microcontroller 210 determines which of the accumulator values of the relevant output 218x will be used to generate the output pulse waveform. The accumulator value that is used depends on the selected mode or format for the output 218x. Thus, if KYZ+ or RTZ Pulse+ mode has been selected for the output 218a, then the microcontroller 210 determines that the value of the OUT1+ accumulator 808 is to be used for creating the pulse waveform on output 218a. Similarly, if KYZ− or RTZ Pulse− mode has been selected for the output 218a, then the microcontroller 210 determines that the value of the OUT1− accumulator 810 is to be used for creating the pulse waveform on output 218a. If, however, if KYZ Add or RTZ Pulse Add mode has been selected for the output 218a, then the microcontroller 210 determines that the value of the OUT1Add accumulator 812 is to be used for creating the pulse waveform on output 218a. The other outputs 218b and 218c are handled in the same way.

It is noted that if the Quadrature mode is selected, then the OUTNet accumulator 826 is used for the outputs 218a and 218b.

In any event, when step 702 is completed, the microcontroller 210 has identified an accumulator value that will be used to generate an output on the relevant one of the outputs 218a, 218b or 218c that is currently being processed.

In step 704, the microcontroller 210 determines whether the accumulator value stored in the corresponding register is sufficient to warrant generating an output pulse on the relevant output 218x. To this end, the value in the relevant accumulator is translated to an output pulse value based on the stored pulse/Wh value for the relevant output 218x. For example, if the first output 218a has a stored pulse/Wh value of 0.15, and the accumulator value has a value in terms of thousandths of watt-hours, then the microcontroller 210 would divide the accumulator value by one thousand to determine of 0.15 watt-hours have been consumed since the last update. If so, then the value stored is greater than or equal to the number required to generate a pulse. (As will be discussed further below, at start-up, there may be multiple-pulses' worth of accumulator value stored, thereby causing the generation of multiple pulses). In general, the accumulator value for the whole number of pulses is subtracted from the accumulator when the pulse(s) is (are) and the remainder accumulator value are replaced into the relevant accumulator.

Thus, in the above example, if the accumulator value is 70, which is equal to 70 thousandths of a watt hour, and the stored pulse/Wh value is 0.15, then the microcontroller 210 would determine that no new pulse is to be generated. However, if the accumulator value is 200, then a new pulse would need to be generated, and a value of 50 will replace the value of 200 in the relevant accumulator. It will be appreciated that, because the remainders are restored in the accumulator, the accumulators 808–824 all store values of accumulated energy consumption that have not yet been outputted as pulses.

In general, the step 704 will occur more frequently than pulses are generated, such that the number in the accumulator will seldom be enough for more than one pulse. One exception, however, is during initialization of the meter. In some cases, AMR or other equipment takes several seconds to initialize while the meter itself can start measuring energy after only a second. To make sure that pulses are generated on the outputs 218a, 218b and 218c in identical fashion as in the AMR device, the meter may delay outputs from the accumulators of FIG. 8 for a few seconds while the AMR device completes its initialization. In such a case, several pulses may be output from the relevant accumulators for a short while to "catch-up".

In any event, once it is determined whether to generate output pulses, the microcontroller 210 proceeds to step 706. In step 706, the microcontroller 210 formulates a pulse(s). Each pulse is generated in the mode-type defined in the configuration parameters in memory 211 for the current output 218x. Each pulse is also formulated to have the minimum on-time and minimum off-time in accordance with the stored configuration parameters for the output 218x. Each pulse is furthermore formulated to have the polarity defined in the stored configuration parameters.

It is noted that one desirable configuration of the output circuit 218 is to use two outputs (e.g. 218a and 218b) to provide the two pulse waveforms that are identical in mode (e.g. KYZ+ or −KYZ+), identical in shape (on-time, off-time, and pulse/Wh values), but have opposite polarity. Such a configuration may be used by an add-on device to distinguish between a power fail situation and a true energy consumption pulse. In particular, because a power fail situation can result in a high logic level transitioning to a low logic level, and some genuine pulse signals similarly exhibit the same transition, power failures can result in an unjustified pulse count. However, the use of the two identical pulse signals having opposite polarity allows for distinguishing between power fail and a true pulse transition. To this end, an energy consumption pulse will always result in one of the two pulse signals transitioning to a high logic level while a power failure situation does not result in either pulse signal transitioning to a high logic level.

The Quadrature mode is a special case because the two outputs 218a and 218b operate in a coordinated fashion. If the Quadrature mode is selected, then the outputs 218a and 218b generate the appropriate quadrature output based on the net value in the OUTNet register 826. The outputs 218a and 218b will also operate in alternating high and low logic level modes, similar to the KYZ modes. Moreover, the output 218b will always follow the output 218a for forward energy flow, and the output 218a will always follow the output 218 in reverse energy flow. Because the pulses are registered alternately to the two outputs 218a and 218b, and because the outputs 218a and 218b use alternating logic level (KYZ type) mode pulses, the pulses will necessarily follow the 00, 01, 11, 10 logic pattern for energy flow in one direction and 10, 11, 01, 00 for energy flow in the other direction. It will be appreciated, however, that such a four state signal may be generated in other ways.

If Direction mode is selected for the relevant output 218x, then the microcontroller 210 merely sets relevant output 218x to the logic level corresponding to the net flow of energy, which may be determined internally using the positive and negative accumulator values.

In any event, once the pulse output is generated and provided to the relevant output 218a, 218b or 218c in step 706, the microcontroller 210 may perform the same task for one of the other outputs, or execute some other task.

It will be appreciated that the output modes, polarity, scaling factors, and on and off times may be manipulated and combined to form a wide variety of outputs having utility for many purposes. Such flexibility allows the meter 200 to take advantage of many possible features on various devices designed for use on electromechanical meters, as well as others. Of course the communication output 216 may be used to provide serial energy usage data to one or more external devices that do not require energy pulses.

It will be appreciated the above described embodiments are merely illustrative, and that those of ordinary skill in the art may readily devise modifications or implementations that incorporate the principles of the present invention and fall within the spirit and scope thereof. For example, at least some of the principles described herein may be applied to other commodity consumption meters, such as gas, oil and/or water meters.

We claim:

1. An apparatus for measuring energy consumption, comprising:
    an input circuit operable to generate a first digital signal representative of a line voltage waveform and a second digital signal representative of a line current waveform;
    a processing circuit operable to generate energy consumption data based on the first digital signal and the second digital signal, the processing circuit further operable to,
        generate a first pulse waveform having a plurality of output pulses based on the energy consumption data, each output pulse corresponding to a quantity of energy consumed, the first pulse waveform having a select one of a plurality predefined of modes and provide the first pulse waveform to a meter output.

2. The apparatus of claim 1 wherein the meter output includes a driver circuit.

3. The apparatus of claim 1 wherein at least one of the plurality of predefined modes defines a pulse for a quantity of energy consumed through power flow in a first direction toward a load and at least another of the plurality of predefined formats defines a pulse for a quantity of energy consumed through power flow in a second direction away from the load.

4. The apparatus of claim 1 wherein at least one of the plurality of predefined modes defines that each pulse includes a first transition, at least predefined duty cycle, and a second transition, and at least another of the plurality of predefined modes defines that each pulse includes a single transition in an opposite direction of a transition of an adjacent pulse.

5. The apparatus of claim 1 wherein the processing circuit is further operable to generate a second pulse waveform associated with the first pulse waveform, the first pulse waveform and second pulse waveform forming a combined output pulse waveform having four states.

6. The apparatus of claim 1 wherein the processing circuit includes a digital signal processor and a microcontroller.

7. The apparatus of claim 1 wherein the processing circuit includes two processor devices, the first processor device operable to generate energy consumption data, and the second processor operable to generate the first pulse waveform.

8. The apparatus of claim 7 wherein the energy consumption data generated by the first processor includes a multiplier and an accumulator coupled to receive an output of the multiplier.

9. The apparatus of claim 7 wherein the energy consumption data generated by the first processor includes a digital value, and wherein the second processor is operable to generate the first pulse waveform based on the digital value.

10. The apparatus of claim 1 further comprising a memory, the memory storing a user selection representative of the select one of the plurality of predefined modes.

11. The apparatus of claim 1 wherein the plurality of predefined modes includes at least one return-to-zero pulse mode and at least one alternating pulse mode.

12. The apparatus of claim 1 wherein the plurality of predefined modes includes at least one format that includes energy direction information.

13. The apparatus of claim 1 wherein processing circuit is further operable to generate the first pulse waveform such that each pulse has a select pulse length, the select pulse length being user configurable.

14. The apparatus of claim 1 further comprising an input for receiving a user selection of the select one of the plurality of predefined modes.

15. An apparatus for measuring energy consumption, comprising:
    an input circuit operable to generate a first digital signal representative of a line voltage waveform and a second digital signal representative of a line current waveform;
    a processing circuit operable to generate energy consumption data based on the first digital signal and the second digital signal, the processing circuit further operable to,
        generate a first pulse waveform having a plurality of output pulses based on the energy consumption data, each output pulse corresponding to a quantity of energy consumed, the first pulse waveform formed based on a plurality of user-defined parameters and provide the first pulse waveform to a meter output.

16. The apparatus of claim 15 wherein at least one of plurality of user-defined parameters includes a minimum on-time period for each pulse.

17. The apparatus of claim 15 wherein at least one of the plurality of user-defined parameters includes a polarity value for the first pulse waveform.

18. A method comprising:
    a) receiving in a meter a user selection of one of a plurality of predefined pulse modes, each pulse mode corresponding to a pulse signal wherein each pulse represents a quantity of a commodity being consumed;
    b) employing digital circuit within the meter to determine a quantity of a commodity consumed by a load connected to the meter;
    c) generating a first pulse waveform in accordance with the user selected one of the plurality of predefined pulse modes;
    d) providing the first pulse waveform to a meter output.

19. The method of claim 18 wherein b) further comprises multiplying digital voltage samples and digital current samples.

20. The method of claim 18 further comprising generating a second pulse waveform, the second pulse waveform being the inverse of the first pulse waveform.

21. The method of claim 18 further comprising generating a second pulse waveform in accordance with a second user selection of the plurality of predefined pulse modes.

22. The method of claim 18 wherein the plurality of predefined modes includes at least one alternating pulse mode and at least a return-to-zero pulse mode.

23. The method of claim 18 wherein the commodity is electrical energy.

* * * * *